United States Patent
Yeh et al.

(10) Patent No.: US 6,251,753 B1
(45) Date of Patent: Jun. 26, 2001

(54) METHOD OF SIDEWALL CAPPING FOR DEGRADATION-FREE DAMASCENE TRENCHES OF LOW DIELECTRIC CONSTANT DIELECTRIC BY SELECTIVE LIQUID-PHASE DEPOSITION

(76) Inventors: Ching-Fa Yeh; Yueh-Chuan Lee; Yuh-Ching Su; Kwo-Hau Wu, all of Department of Electronics Engineering & Institute of Electronics, National Chiao Tung University, Hsinchu (TW)

( * ) Notice: Subject to any disclaimer, the term of this patent is extended or adjusted under 35 U.S.C. 154(b) by 0 days.

(21) Appl. No.: 09/447,715

(22) Filed: Nov. 23, 1999

(51) Int. Cl.$^7$ .................................................. H01L 21/76
(52) U.S. Cl. ........................... 438/445; 424/435; 424/637
(58) Field of Search .................................. 438/424, 433, 438/435, 637, 445

(56) References Cited

U.S. PATENT DOCUMENTS

| | | | |
|---|---|---|---|
| 5,445,989 | * | 8/1995 | Lur et al. ............................. 438/433 |
| 5,453,395 | * | 9/1995 | Lur ....................................... 438/433 |
| 5,472,898 | * | 12/1995 | Hong et al. ........................... 438/438 |
| 5,786,263 | * | 7/1998 | Perera .................................. 438/424 |
| 5,801,082 | * | 9/1998 | Tseng ................................... 438/782 |
| 5,801,083 | * | 9/1998 | Yu et al. .............................. 434/424 |
| 6,156,671 | * | 12/2000 | Chang et al. ......................... 438/778 |

\* cited by examiner

*Primary Examiner*—Charles Bowers
*Assistant Examiner*—David S. Blum
(74) *Attorney, Agent, or Firm*—Lowe Hauptman Gilman & Berner, LLP

(57) ABSTRACT

A low dielectric constant (k) material, such as methylsilsesquioxane (MSQ), used as an interlevel dielectric is expected to reduce the parasitic capacitance in integrated circuit. However, MSQ film can be easily degraded during resist ashing after the film is etched with the damascene trenches being created. The present invention discloses an innovative sidewall capping technology to solve the degradation issue. Prior to resist ashing, a high-quality, low-k oxide film is selectively deposited onto the sidewalls of MSQ trenches using selective liquid-phase deposition. Experimental results demonstrate that the capping oxide can effectively protect the sidewalls of MSQ trenches from ashing-induced degradation.

13 Claims, 4 Drawing Sheets

METHOD OF SIDEWALL CAPPING FOR DEGRADATION-FREE DAMASCENE TRENCHES OF LOW DIELECTRIC CONSTANT DIELECTRIC BY SELECTIVE LIQUID-PHASE DEPOSITION

FIELD OF THE INVENTION

The present invention is related to an interlayer dielectric with a low dielectric constant (k) for reducing the parasitic capacitance between metal interconnection lines such as Cu damascene, and in particular to a method for capping sidewalls of damascene trenches of the interlayer dielectric to protect the interlayer dielectric from ashing-induced degradation.

BACKGROUND OF THE INVENTION

As device geometry is scaled down to deep submicron region, the parasitic capacitance between closely spaced metal lines becomes important in terms of the resistance-capacitance time delay for device switching [M. T. Bohr, in *Tech. Dig. IEEE Int. Electron Devices Meet.*, 241 (1995)]. A novel interlevel dielectric (ILD) with a low dielectric constant (k) is thus required to reduce the parasitic capacitance. Spin-on coated methylsilsesquioxane (MSQ) is very promising as a novel ILD, due to its low k value (~2.8) and superior thermal stability (~500° C.). However, the MSQ film can be degraded in the resist ashing step after damascene trenches of the film are patterned using dry etching [J. Waeterloos, H. Meynen, B. Coenegrachts, S. Vanhaelemeersch, J. Grillaert, and L. Van den hove, in *Advanced Metallization and Interconnect Systems for ULSI Applications in* 1995, R. C. Ellwanger and S. Q. Wang, Editors, p.75 (1996); J. J. Yang, S. Q. Wang, L. Forester, and M. Ross, in *Advanced Metallization for ULSI Application in* 1997, R. Cheung, J. Klein, K. Tsubouchi, M. Marakami, and N. Kobayashi, Editors, p. 359 (1997)]. The degraded MSQ film can easily become hygroscopic, and seriously lose its benefit of having low k. Therefore, ashing-induced degradation becomes an important issue in terms of applying MSQ film as an option for damascene integration.

A primary object of the present invention is to provide a method to improve the drawback of the prior art.

SUMMARY OF THE INVENTION

A low dielectric constant (k) material, such as methylsilsesquioxane (MSQ), used as an interlevel dielectric is expected to reduce the parasitic capacitance in integrated circuit. However, MSQ film can be easily degraded during resist ashing after damascene trenches of the MSQ film is created with lithography and dry etching. In the present invention, an innovative sidewall capping technology is developed to solve the degradation issue. Prior to resist ashing, a high-quality, low-k oxide film is selectively deposited onto the sidewalls of MSQ trenches using selective liquid-phase deposition. Experimental results demonstrate that the capping oxide can effectively protect the sidewalls of MSQ trenches from ashing-induced degradation.

A method of forming a trench, a via or a contact hole in a dielectric layer on a substrate with a capping layer thereon accomplished according to the innovative sidewall capping technology of the present invention comprises the following steps:

(a) forming a dielectric layer on a substrate, preferably the dielectric layer being a low dielectric constant dielectric having a dielectric constant lower than 3.0, such as methylsilsesquioxane;

(b) forming a photoresist layer on the dielectric layer;

(c) forming a trench, a via or a contact hole in said dielectric layer by photolithography, wherein the photoresist is patterned and the dielectric layer is etched by using the patterned photoresist as a mask;

(d) forming a capping layer on side walls of said trench, said via or said contact hole and substantially not on the patterned photoresist by a selective liquid phase deposition of silicon dioxide; and (e) stripping said patterned photoresist.

In the method of the present invention, the dielectric layer will become more hygroscopic when it is subjected to the stripping in step (e).

In step (e) of the method of the present invention, the stripping may be carried out by ozone ashing.

In the method of the present invention, the capping layer formed in step (d) preferably has a dielectric constant dielectric lower than 3.9, and more preferably lower than 3.5.

A suitable process for carrying out the selective liquid phase deposition of silicon dioxide in step (d) comprises immersing the substrate from step (c) in a silica-supersaturated solution, wherein the silica-supersaturated solution is prepared by increasing a temperature of a silica-saturated hydrofluosilicic acid ($H_2SiF_6$) solution containing 0.5–5.0 M concentration of hydrofluosilicic acid by about 10° C. Preferably, the silica-saturated hydrofluosilicic acid solution is prepared at 0° C. and the silica-supersaturated solution is prepared by raising the 0° C. silica-saturated hydrofluosilicic acid solution to about 25° C.

Preferably, the method of the present invention further comprises (a') forming a nitride layer on said dielectric layer prior to step (b), wherein the nitride layer is etched together with the dielectric layer in step (c) by using the patterned photoresist as a mask. More preferably, the method of the present invention further comprises (d') selectively removing a bottom capping layer formed at a bottom of said trench during step (d) by anisotropic etching prior to step (e), wherein the nitride film on said trench remains intact.

Preferably, the method of the present invention further comprises (c') leaning side walls of said trench, said via or said contact hole prior to step (d) by etching.

DETAILED DESCRIPTION OF THE PREFERRED EMBODIMENTS OF THE INVENTION

Figure 1A:
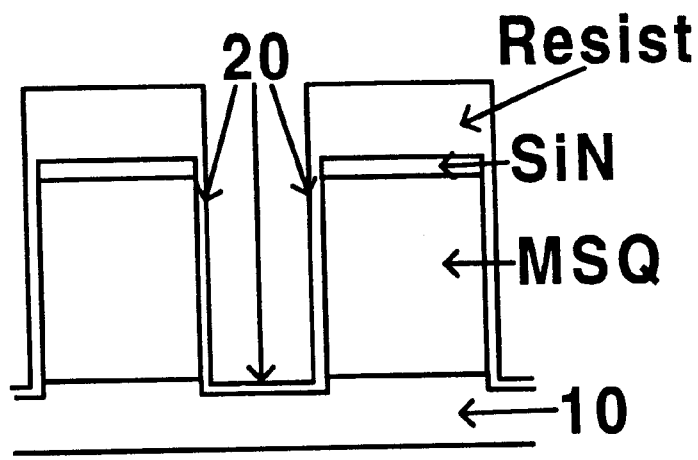
FIGS. 1(a) to FIG. 1(d) show schematic cross-sectional views of MSQ trenches in four key process steps for preparing degradation-free MSQ trenches using sidewall capping technology according to the present invention: (a) trench patterning, (b) sidewall cleaning, (c) sidewall capping and (c) resist stripping.
Figure 1B:
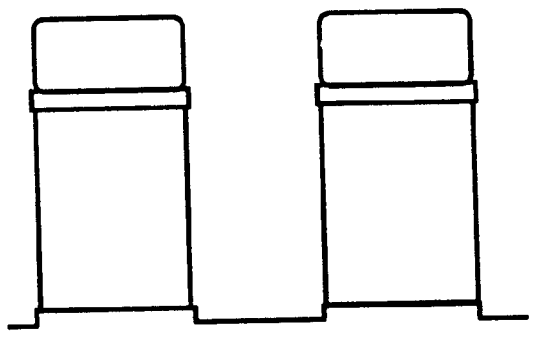
Figure 1C:
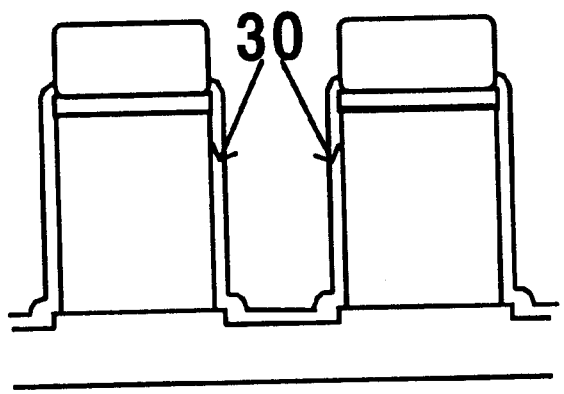
Figure 1D:
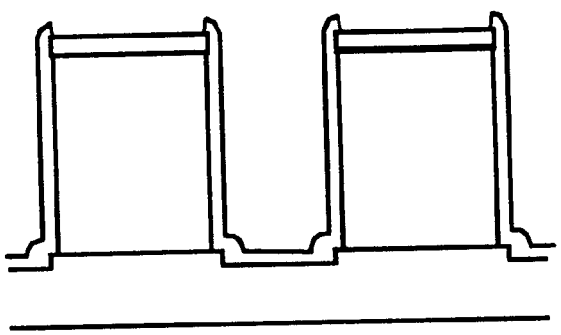

In the present invention, we develop an innovative capping technology to selectively deposit a thin capping layer on the sidewalls of MSQ trenches prior to resist ashing. This capping technology will be demonstrated by using selective liquid-phase deposition (S-LPD). In addition, we will also illustrate the effectiveness of the capping layer in terms of protecting MSQ trenches from ashing-induced degradation.

Experimental

Four key process steps, shown in FIG. 1, are used to illustrate the preparation of degradation-free MSQ trenches using sidewall capping technology, and they are: (a) trench patterning, (b) sidewall cleaning, (c) sidewall capping, and (d) resist stripping. A layer of 0.8 $\mu$m-thick MSQ was first coated on a 0.6 $\mu$m-thick wet oxide 10. Next, a layer of 0.04 $\mu$m-thick SiN as a top capping layer was deposited on the MSQ by plasma-enhanced chemical vapor deposition. The MSQ trenches with 0.6 $\mu$m linewidth/space were then patterned by using resist photolithography and dry etching (FIG. 1(a)). After dry etching, the thin residual polymers 20 left on the sidewalls and the bottoms of MSQ trenches were removed via oxygen plasma treatment, which was conducted at a low-pressure (125 mTorr) and low-temperature (no intended heating) condition for only 20 sec. However, the surface layer on the sidewall of MSQ would also have been slightly oxidized by the oxygen plasma treatment, and it should be completely cleared off in HF-based etching solution (FIG. 1(b)). After the remaining MSQ/resist trenches were baked at 150° C. for 3 min to be dehydrated, a layer of capping oxide 30 was selectively deposited on the MSQ sidewalls and the bottoms instead of on the resist by using liquid phase deposition (LPD) method (FIG. 1(c)). This selective deposition technique is based on the mechanism that the LPD oxide film can only be substantially deposited on the surface containing Si—OH bonds [T. Homma, T. Katoh, Y. Yamada, and Y. Murao, *J. Electrochem. Soc.* 140, 2410 (1993)]. The technique, termed S-LPD, has been well developed and applied before [T. Homma, T. Katoh, Y. Yamada, and Y. Murao, *J. Electrochem. Soc.* 140, 2410 (1993); C. F. Yeh, C. H. Liu, and J. L. Su, *IEEE Electron Letters,* 20, 39 (1999); C. F. Yeh, C. H. Liu, and J. L. Su, *J. Electrochem. Soc.* 146, 2294 (1999)). in addition to its property of being able to be deposited selectively, the LPD oxide film possesses several attractive features like: room-temperature deposition, ultralow deposition rate (20 nm/hr), low k (k~3.46), low stress (~41 MPa) and fluorine incorporation (~8.6 at. %). Moreover, the LPD oxide has been verified very stable in moist ambient [C. F. Yeh, Y. C. Lee and S. C. Lee, in *Low-Dielectric Constant Materials IV, Mat. Res. Soc. Symp. Proc.,* 511, C. Chiang, P. S. Ho, T. M. Lu, and J. T. Wetzel, Editors, p. 57 (1998)]. The process for depositing the capping oxide is briefly described as below. Silica powder was added into a 4 M $H_2SiF_6$ solution and then dissolved by stirring at 0° C. for 24 hr to make the solution saturated with silica. After removing the undissolved silica by filtering, the saturated solution was heated to 25° C. and became supersaturated. The wafers with MSQ trenches were immersed in the solution and, then, selectively deposited with oxide films onto the trenchs' sidewalls. After sidewall capping, the resist on MSQ was stripped by using conventional ozone ashing (~1 atm, 300° C., 65 sec), and cleaned in $H_2SO_4/H_2O_2$ solution afterwards. Steps to complete the degradation-free MSQ trenches were finished after resist stripping step as shown in FIG. 1(d).

Scanning electron microscopy (SEM) was employed to observe the cross-sectional area of trenches corresponding to each key process step. The changes in chemical bonding structure of MSQ sidewalls are necessary to be examined before and after ashing to investigate the effectiveness of the capping oxide, using Fourier transform infrared spectroscopy (FTIR). In addition, to investigate whether the MSQ sidewalls have become degraded and hygroscopic after ashing, it is indispensable to study the desorbed moisture with thermal desorption spectroscopy (TDS) during heating. For comparison, the MSQ trenches without sidewall capping were also prepared.

Results and Discussion

Figure 2:
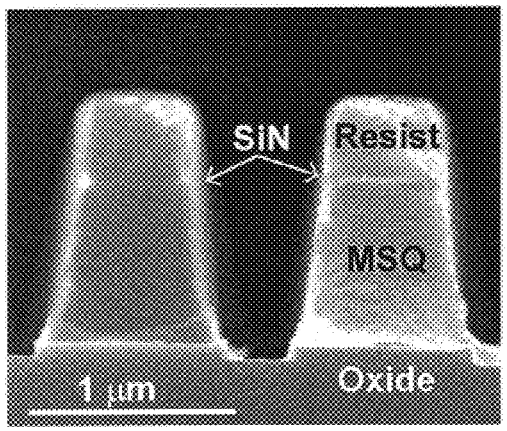
FIGS. 2(a) to FIG. 2(d) are cross-sectional SEM images of MSQ trenches after (a) trench patterning, (b) sidewall cleaning, (c) sidewall capping and (c) resist stripping.
Figure 2:
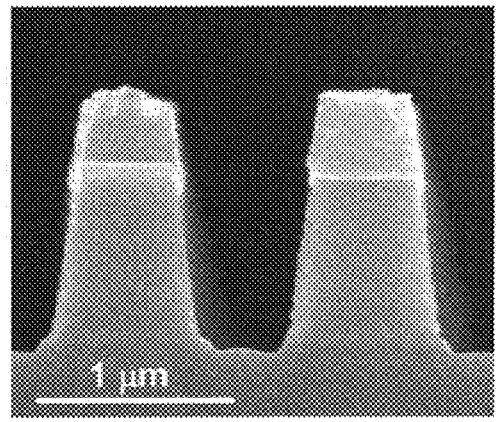
Figure 2:
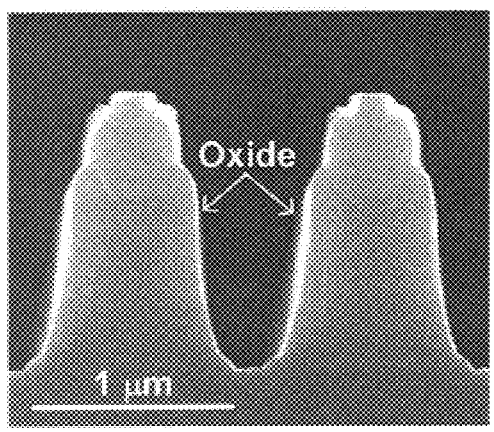
Figure 2:
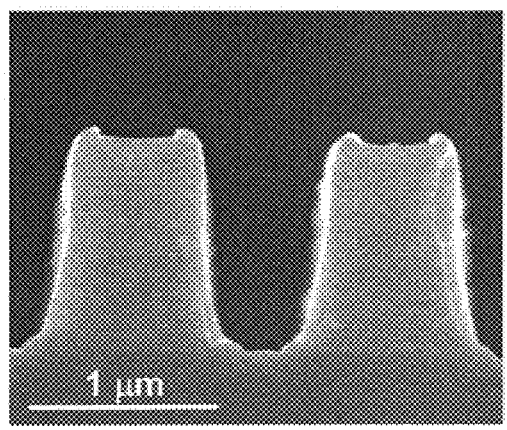

FIGS. 2(a)–(d) show the cross-sectional images of degradation-free MSQ trenches corresponding to the four key process steps. After the MSQ film is etched (FIG. 2(a)), there still exist residual polymers 20 on the sidewalls and the bottoms of MSQ trenches, which will interfere with the deposition of capping oxide onto the trenches. The oxygen plasma treatment was adopted to remove the polymer layer because of its negligible impact on the MSQ surface compared with the conventional ashing [J. Waeterloos, H. Meynen, B. Coenegrachts, S. Vanhaelemeersch, J. Grillaert, and L. Van den hove, in *Advanced Metallization and Interconnect Systems for ULSI Applications in* 1995, R. C. Ellwanger and, S. Q. Wang, Editors, p.75 (1996); S. Ito, Y. Homma, E. Sasaki, S. Uchimura, and H. Morishima, *J. Electrochem. Soc.* 137, 1212 (1990)]. Actually, the treatment only induces less than 28 Å shrinkage on each MSQ sidewall. Subsequently the wet cleaning step can remove the thin oxidized MSQ layer (~30 nm), but hardly etch the bulk of MSQ due to its high selectivity (12.6:1). Thus the sidewall cleaning can completely remove the polymer and the porous oxidized layer, exposing the surface of bulk MSQ. FIG. 2(b) demonstrates the slight side etching from the fact that the 30 nm-thick layer on each MSQ sidewall was etched. Next, as illustrated in FIG. 2(c), after capping 60 nm-thick oxide on the sidewalls, the trench space indeed became smaller than that before capping. It also reveals that a thin oxide layer has been capped on the sidewalls. Most importantly, S-LPD oxide does not cap the resist, therefore there is no problem in stripping resist.

MSQ trenches with oxide films on the sidewalls and nitride films on the tops were never exposed and degraded in an oxidizing ambient. As shown in FIG. 2(d), after stripping resist the MSQ trench processes are finished. The oxide "ears" on the top corners of trench are formed due to the deposition of oxide in vertical and horizontal directions. The ears will become higher as the oxide films on sidewalls become thicker.

During the application of the capping technology, the trench sidewalls should be first slightly etched for cleaning and then deposited with oxide. Therefore, under well-optimized process conditions, the etched sidewalls can be completely recovered with the highly conformal LPD oxide (sidewall step coverage ~95%). On the other hand, there is a concern that the LPD oxide films on the trench bottoms may block the contact with the underlying metal. In practical processes, an additional anisotropic etching performed after the process step (c) (sidewall capping) is suggested to selectively remove the LPD oxide films on the bottoms of trench with the nitride films on the tops thereof intact. The additional etching is also expected to simultaneously remove the oxide ears.

Figure 3:
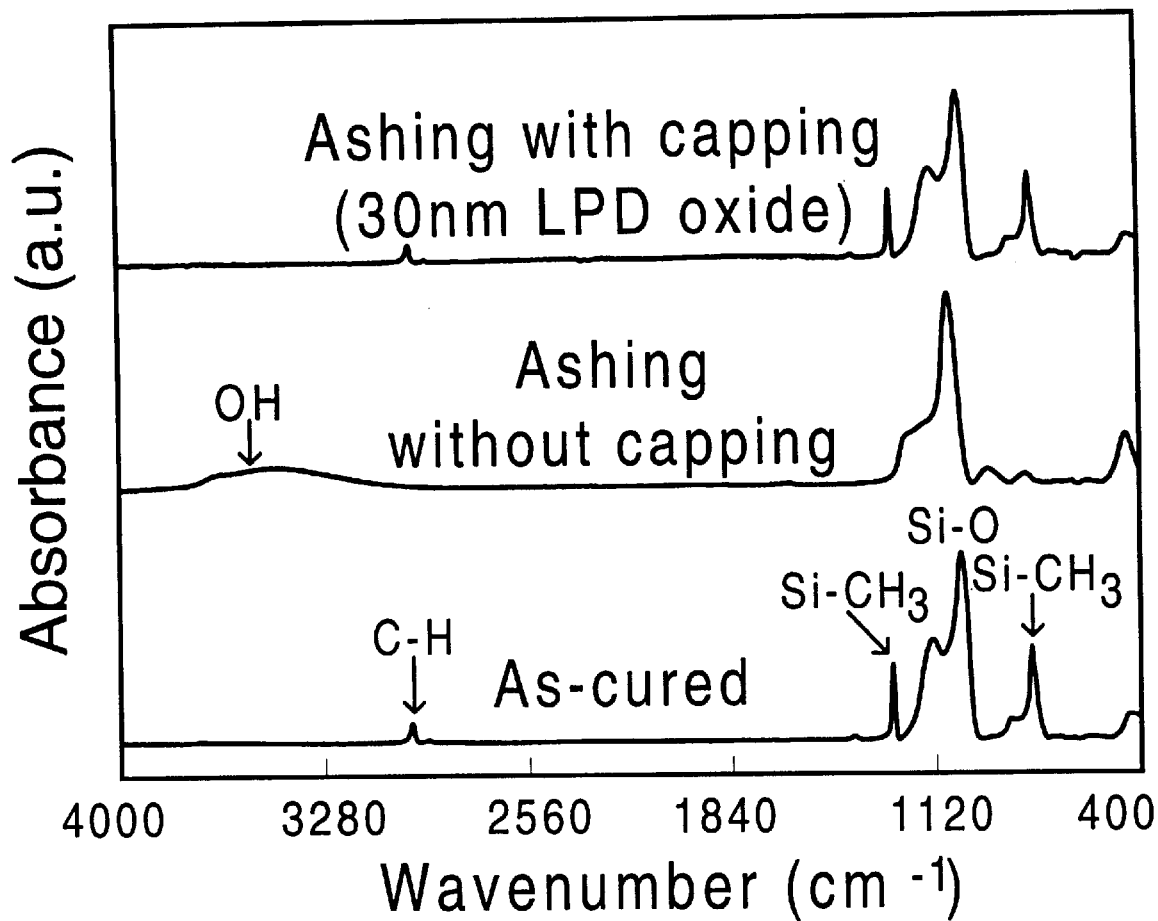
FIG. 3 is a plot showing comparison of FTIR spectra for as-cured MSQ film and MSQ films with/without capping after resist ashing.

The FTIR spectra for as-cured MSQ film, MSQ films with/without capping after ozone ashing are compared in FIG. 3. As a simulation of MSQ trench sidewall with capping, MSQ film with capping has been treated with the same sidewall cleaning treatments (process step (b)) before being deposited with capping oxide. As-cured MSQ film contains a lot of Si—CH$_3$ bonds in the Si—O backbone, in terms of intense Si—CH$_3$ peaks at 780 cm$^{-1}$ and 1275 cm$^{-1}$, and C—H peak at 2970 cm-$^1$ in its spectrum. For MSQ film without capping after ashing, the Si—CH$_3$ peaks and the C—H peak disappear; but the OH peaks at 3000~3800 cm$^{-1}$ arise. Obviously ozone ashing has changed the bonding structure of MSQ and transformed Si—CH$_3$ bonds into Si—OH bonds, which can easily absorb water during exposed to moist ambient [M. Yoshimaru, S. Koizumi, K. Shimokawa, and J. Ida, in *Proceedings of the 35$^{th}$ Annual IEEE International Reliability Physics Symposium*, 234 (1997)]. However, for MSQ film with capping (~30 nm), the peaks of both Si—CH$_3$ and C—H are still preserved, and no OH peak is observed even after ozone ashing.

Figure 4:
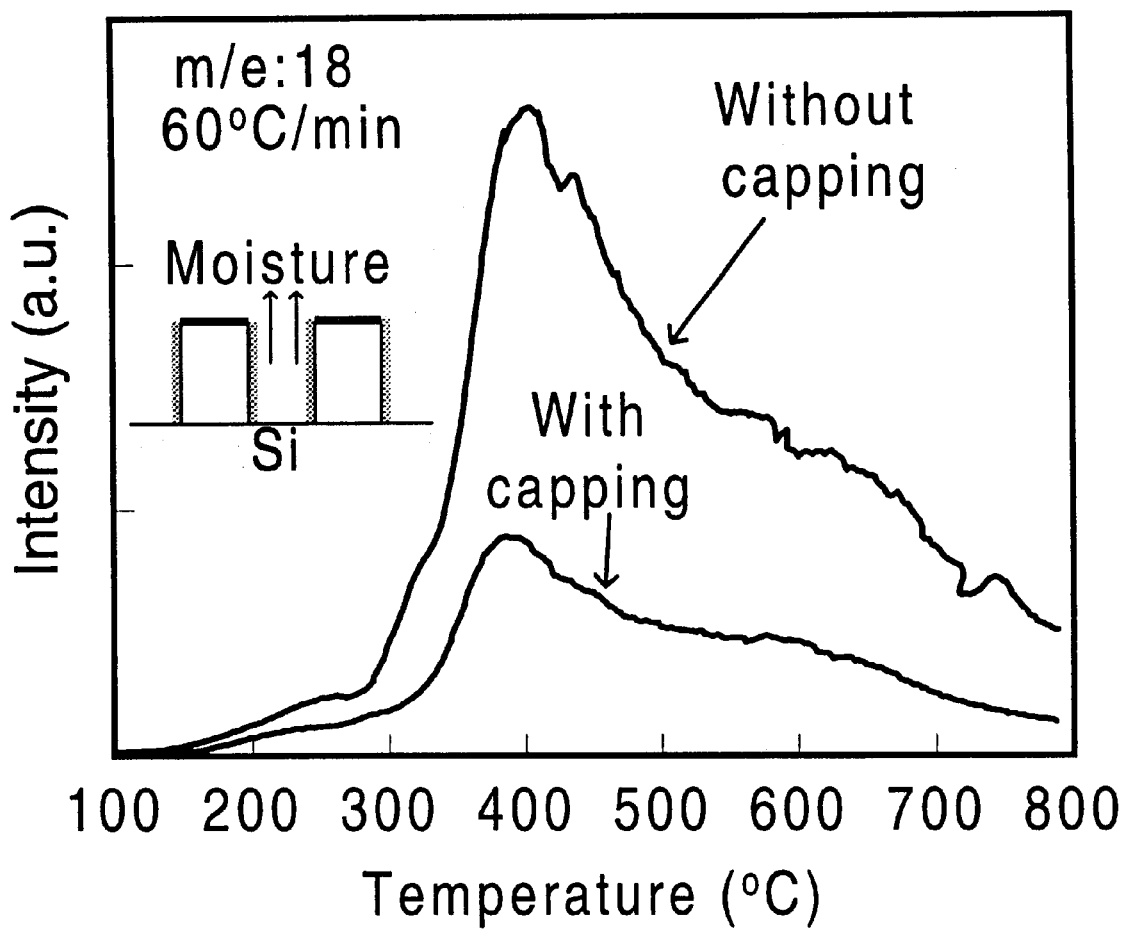
FIG. 4 is a plot showing comparison of TDS spectra for MSQ trenches with/without capping within the temperature range of 100° C.~800° C.

FIG. 4 compares the TDS spectra for the MSQ trenches with/without sidewall capping within the temperature range of 100° C.~800° C. Both samples were stored in clean room (23° C., 45% RH) for two days before TDS measurement. In respect of the MSQ trenches with sidewall capping, the water outgassing intensity is much less than that of MSQ trenches without capping over the entire temperature range. In particular, the water outgassing intensity for MSQ trenches with sidewall capping at ~400° C. is only one third of that for MSQ trenches without capping. The water outgassing at ~400° C. can be attributed to Si—OH bonds in the film. Therefore, less moisture absorption is demonstrated to be the nature of the MSQ trenches with sidewall capping, which is also in consistency with the result obtained from the FTIR spectra. MSQ trenches with sidewall capping have shown that they are degradation-free because of the evidences mentioned above.

What is claim is:

1. A method of forming a trench, a via or a contact hole in a dielectric layer on a substrate with a capping layer thereon, said method comprising the steps of:
   (a) forming a dielectric layer on a substrate;
   (b) forming a photoresist layer on the dielectric layer;
   (c) forming a trench, a via or a contact hole in said dielectric layer by photolithography, wherein the photoresist is patterned and the dielectric layer is etched by using the patterned photoresist as a mask;
   (d) forming a capping layer on side walls of said trench, said via or said contact hole and substantially not on the patterned photoresist by a selective liquid phase deposition of silicon dioxide; and
   (e) stripping said patterned photoresist.

2. The method according to claim 1, wherein the dielectric layer is a low dielectric constant dielectric having a dielectric constant lower than 3.0.

3. The method according to claim 2, wherein the dielectric layer is methylsilsesquioxane.

4. The method according to claim 1, wherein the dielectric layer is a low dielectric constant dielectric which will become more hygroscopic when it is subjected to the stripping in step (e).

5. The method according to claim 1, wherein the stripping in step (e) is carried out by ozone ashing.

6. The method according to claim 4, wherein the stripping in step (e) is carried out by ozone ashing.

7. The method according to claim 1, wherein the capping layer formed in step (d) has a dielectric constant dielectric lower than 3.9

8. The method according to claim 1, wherein the capping layer formed in step (d) is a fluorine-containing silicon dioxide has a dielectric constant dielectric lower than 3.5.

9. The method according to claim 8, wherein selective liquid phase deposition of silicon dioxide is carried out by immersing the substrate from step (c) in a silica-supersaturated solution, wherein the silica-supersaturated solution is prepared by increasing a temperature of a silica-saturated hydrofluosilicic acid (H$_2$SiF$_6$) solution containing 0.5–4.0 M concentration of hydrofluosilicic acid by about 10° C.

10. The method according to claim 9, wherein the silica-saturated hydrofluosilicic acid solution is prepared at 0° C. and the silica-supersaturated solution is prepared by raising the 0° C. silica-saturated hydrofluosilicic acid solution to about 25° C.

11. The method according to claim 1 further comprising (a') forming a nitride layer on said dielectric layer prior to step (b), wherein the nitride layer is etched together with the dielectric layer in step (c) by using the patterned photoresist as a mask.

12. The method according to claim 1 further comprising (c') cleaning side walls of said trench, said via or said contact hole prior to step (d) by etching.

13. The method according to claim 11 further comprising (d') selectively removing a bottom capping layer formed at a bottom of said trench during step (d) by anisotropic etching prior to step (e), wherein the nitride film on said trench remains intact.

* * * * *